(12) United States Patent
Krasowski

(10) Patent No.: US 7,688,117 B1
(45) Date of Patent: Mar. 30, 2010

(54) N CHANNEL JFET BASED DIGITAL LOGIC GATE STRUCTURE

(75) Inventor: Michael J. Krasowski, Chagrin Falls, OH (US)

(73) Assignee: The United States of America as represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 12/081,762

(22) Filed: Apr. 21, 2008

(51) Int. Cl.
*H03K 19/20* (2006.01)
*H03K 19/094* (2006.01)

(52) U.S. Cl. .................. 326/112; 326/104; 326/119
(58) Field of Classification Search .............. 326/104, 326/112, 116, 119–120
See application file for complete search history.

(56) References Cited

U.S. PATENT DOCUMENTS

| | | | |
|---|---|---|---|
| 4,028,556 A | * | 6/1977 | Cachier et al. ............. 326/115 |
| 4,523,111 A | | 6/1985 | Baliga |
| 4,695,743 A | * | 9/1987 | Des Brisay, Jr. ........... 327/203 |
| 4,810,969 A | * | 3/1989 | Fulkerson ................. 326/116 |
| 5,160,858 A | * | 11/1992 | Kataoka et al. ............ 326/119 |
| 5,396,085 A | | 3/1995 | Baliga |
| 5,973,550 A | | 10/1999 | Bowers et al. |
| 6,124,734 A | * | 9/2000 | Davenport ................. 326/83 |
| 6,365,919 B1 | | 4/2002 | Tihanyi et al. |
| 6,373,318 B1 | | 4/2002 | Dohnke et al. |
| 6,503,782 B2 | | 1/2003 | Casady et al. |
| 6,859,021 B2 | | 2/2005 | Link |
| 6,900,537 B2 | | 5/2005 | Sridevan |
| 7,242,040 B2 | | 7/2007 | Sankin et al. |

(Continued)

FOREIGN PATENT DOCUMENTS

WO    WO 97/34322    9/1997

OTHER PUBLICATIONS

P. Friedrichs et al., "SiC Power Devices With Low On-Resistance For Fast Switching Applications," May 22-25, 2000, pp. 213-216.
H. Takagi et al., "Complementary JFET Negative-Resistance Devices," Dec. 1975, IEEE Journal of Solid-State Circuits, vol. SC-10, No. 6, pp. 509-515.

(Continued)

*Primary Examiner*—Anh Q Tran
(74) *Attorney, Agent, or Firm*—Robert H. Earp, III; Alicia Choi

(57) ABSTRACT

A circuit topography is presented which is used to create usable digital logic gates using N (negatively doped) channel Junction Field Effect Transistors (JFETs) and load resistors, level shifting resistors, and supply rails whose values are based on the direct current (DC) parametric distributions of those JFETs. This method has direct application to the current state of the art in high temperature, for example 300° C. to 500° C. and higher, silicon carbide (SiC) device production. The ability to produce inverting and combinatorial logic enables the production of pulse and edge triggered latches. This scale of logic synthesis would bring digital logic and state machine capabilities to devices operating in extremely hot environments, such as the surface of Venus, near hydrothermal vents, within nuclear reactors (SiC is inherently radiation hardened), and within internal combustion engines. The basic logic gate can be configured as a driver for oscillator circuits allowing for time bases and simple digitizers for resistive or reactive sensors. The basic structure of this innovation, the inverter, can be reconfigured into various analog circuit topographies through the use of feedback structures.

13 Claims, 8 Drawing Sheets

U.S. PATENT DOCUMENTS

2006/0007727 A1  1/2006  Harrison et al.
2007/0029573 A1  2/2007  Cheng et al.
2007/0096144 A1  5/2007  Kapoor
2007/0187717 A1  8/2007  Sadaka et al.
2007/0216469 A1  9/2007  Sakamoto

OTHER PUBLICATIONS

David Spry, et al., "Electrical Operation of 6H-SiC MESFET at 500° C for 500 Hours in Air Ambient", 2004 IMAPS International High Temperature Electronics Conference, Santa Fe, NM, May 18-20, 2004.

* cited by examiner

NOT(B) = A1 * A2 *...* An

NOT (B) = A1 + A2 + ... + Am

N CHANNEL JFET BASED DIGITAL LOGIC GATE STRUCTURE

STATEMENT OF GOVERNMENT INTEREST

The invention described herein was made by an employee of the United States Government and may be manufactured and used by or for the Government of the United States of America for governmental purposes without the payment of any royalties thereon or therefor.

BACKGROUND OF THE INVENTION

1. Field of the Invention

The present invention relates to a circuit topography which is used to create usable digital logic gates using N (negatively doped) channel Junction Field Effect Transistors (JFETs) and load resistors, level shifting resistors, and supply rails whose values are based on the direct current parametric distributions of those JFETs. This method has direct application to the current state of the art in high temperature (300° C. to 500° C. and higher) silicon carbide (SiC) device production.

2. Description of the Related Art

There are current reasons for placing intelligent processing near or within sources of high temperature on the order of, for example, 300° C. and higher. Electronic components for use in these temperatures are typically made of silicon carbide (SiC), which can operate in temperatures as high as 600° C. However, processing, either in an analog domain or a digital domain, requires components whose parameters are closely matched, and as a consequence, often exist on the same die, as in integrated circuits. Current processing needs exceed SiC integrated circuit production capabilities, which do not allow for highly integrated circuits.

It is currently possible to produce a single component to small number of components of (negatively doped) N channel Junction Field Effect Transistors (JFETs) and epitaxial resistors on a single substrate. In order to produce these components, the quest was to find a way to synthesize usable logic blocks from these devices, knowing that parameters such as gate to source turn off voltage and drain saturation current, may vary from part to part by multiples of five to ten.

These parameter distribution issues precluded conventional direct coupled and buffered direct coupled FET logic techniques which depend upon precise manipulation and matching of transistor channel widths. Other logic techniques required mixes of complementary P (positively doped) and N (negatively doped) channel devices or mixes of depletion and enhancement mode devices. These other technologies typically worked at temperatures no greater than 125° C., for silicon, with various other technologies operational from 225° C. up to 400° C. As stated earlier, SiC can operate in temperatures up to 600° C.

The lack of precise device to device control over device parameters in discrete SiC JFET production and the lack of complementary devices created the need to use resistors as loads and as level shifters. Thus, in the current state of the art, one would normally use current sources, push pull stages or dropping diodes available using lower temperature technologies to configure logic gates.

If one creates a method to produce these logic functions of inversion, combination and latching, one would bring basic intelligent capability to devices operating in harsh thermal environments. For example, one could create a SiC pressure sensor in a jet engine with a frequency output which could have its output sent through a binary polynomial generator created out of SiC flip-flops and exclusive OR gates. If the output frequency of the sensor is logically ANDed with the output of the generator, a unique envelope would be associated with that sensor and when detected by a radio receiver, the signal could be demodulated in a correlation space and differentiated from all the other sensors using different polynomials. A further example would be a surface rover on Venus which uses a simple digital state machine for decision making and control, allowing it to exhibit useful behaviors.

SUMMARY

An embodiment of the present invention is directed to an apparatus configured to create digital logic gates. The apparatus comprises a first field effect transistor, at a front end, whose source is tied to zero volts and whose drain is tied to voltage (Vdd) through a first resistor. The apparatus also comprises a second field effect transistor, following the front end, configured as a unity gain buffer whose drain is tied to the Vdd, whose gate is tied to a node connecting the first field effect transistor to the first resistor, and whose drain is tied to a series combination of a second resistor and a third resistor. For a logic false input, the output is at logic true and for a logic true input, the output is at logic false.

Another embodiment of the invention is directed to a method including placing, at a front end of an inverter, a first field effect transistor whose source is tied to zero volts and whose drain is tied to voltage (Vdd) through a first resistor. The method also includes placing, following the front end, a second field effect transistor configured as a unity gain buffer whose drain is tied to the Vdd, whose gate is tied to a node connecting the first field effect transistor to the first resistor, and whose drain is tied to a series combination of a second resistor and a third resistor. For a logic false input, the output is at logic true and for a logic true input, the output is at logic false.

Another embodiment of the invention is directed to an apparatus including placing means for placing, at a front end of an inverter, a first field effect transistor whose source is tied to zero volts and whose drain is tied to voltage (Vdd) through a first resistor. The apparatus also includes placing means for placing, following the front end, a second field effect transistor configured as a unity gain buffer whose drain is tied to the Vdd, whose gate is tied to a node connecting the first field effect transistor to the first resistor, and whose drain is tied to a series combination of a second resistor and a third resistor. For a logic false input, the output is at logic true and for a logic true input, the output is at logic false.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention, wherein:

FIG. 2b illustrates the logical representation of FIG. 2a;

FIG. 3a illustrates another embodiment of an inverter architecture with a parallel string of m FETs;

FIG. 3b illustrates the logical representation of FIG. 3a;

DETAILED DESCRIPTION OF EMBODIMENTS

Reference will now be made to the embodiments of the present invention, examples of which are illustrated in the accompanying drawings.

An embodiment of the present invention is directed to a circuit topography which is used to create digital logic gates using N (negatively doped) channel Junction Field Effect Transistors (JFETs) and load resistors, level shifting resistors and supply rails whose values are based on the direct current (DC) parametric distributions of those JFETs. This method has direct application to the current state of the art in high temperature, for example higher than 300° C., silicon carbide (SiC) device production. The ability to produce inverting and combinatorial logic enables the production of pulse and edge triggered latches. This scale of logic synthesis brings digital logic and state machine capabilities to devices operating in extremely hot environments like the surface of Venus, near hydrothermal vents, within nuclear reactors and within internal combustion engines.

As is known to those skilled in the art, SiC is inherently radiation hardened. The basic logic gate can be configured as a driver for oscillator circuits allowing for time bases and simple digitizers for resistive or reactive sensors. The inverter of the present invention can be reconfigured into various analog circuit topographies through the use of feedback structures.

Due to the variability in SiC device parameters, an embodiment of the present invention implements a circuit design to allow logic gates to be developed using only epitaxial resistors and N Channel JFETs. The resistor values are a function of the supply voltage, which in turn, is a function of the transistor turn-off voltage.

In an embodiment of the invention, a JFET technology, the U401 dual N channel JFET, was chosen. However, it should be noted that any N channel FET could be used, including SiC devices. The U401 parameters of the embodiment are Vgs (off)=−0.5 to −2.5 volts. The saturation drain current Idss=0.5 mA to 10 mA.

Figure 1:
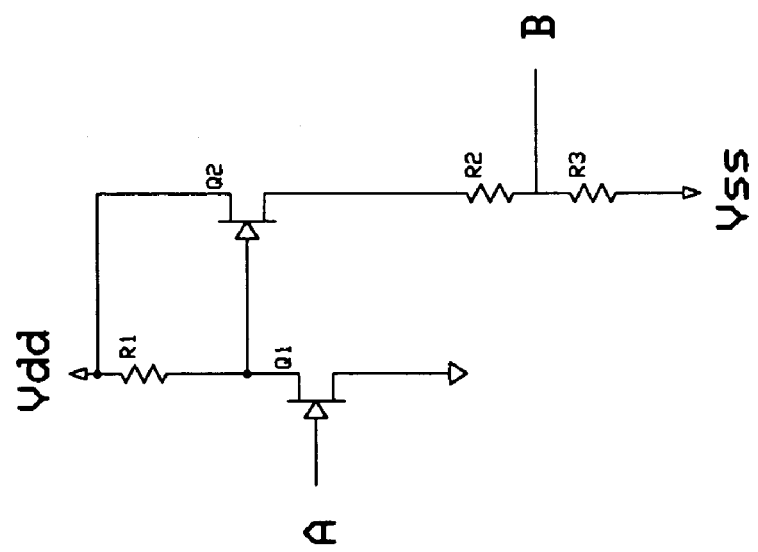
FIG. 1 illustrates an example of a simple inverter architecture in which an embodiment the present invention may be implemented.

FIG. 1 is an example of a simple inverter architecture. The front end of the inverter is comprised of one FET, Q1, whose source is tied to 0 volts, which is called ground. Its drain is tied to Vdd through a resistor R1. According to FIG. 1:

Vdd=2×(|Vgs(off) MAX|), or 2×(2.5)=5 volts.

R1>>Vdd/(Idss(min)), or 5/0.005=1,000 ohms

FIG. 1 further shows that following the front end is a FET, Q2, configured as a unity gain buffer whose drain is tied to Vdd, whose gate is tied to the node connecting Q1 and R1, and whose drain is tied to the series combination of resistors, R2 and R3. The bottom of R3 is tied to Vss. Vss is given as:

Vss=−Vdd.

In this embodiment of the invention, R2=R3=R1. The input is the gate of Q1, illustrated as point A. The output of the gate is given as the node where R2 connects to R3 and is illustrated as point B. A logic 1 (true) is given as 0 volts or ground. A logic 0 (false) is given as −0.5 Vss or −2.5 volts.

With a logic 0 (−2.5 volts) at point A, Q1 is turned off such that its drain voltage is at Vdd potential pulled up through R1. Q2, wired as a follower, biases itself on, and given that the Rs are chosen as a function of Idss(min) and Vdd, there is little drop across Q1 and so the voltage at source of Q1 and the top of R2 is approximately Vdd. Thus, with R2=R3, the voltage at point B is the midpoint between Vdd and Vss which is 0 volts or ground.

With a logic 1 (0 volts) at point A, Q1 is turned on such that its drain voltage is at ground potential with Vdd dropped across R1. Q2, wired as a follower, biases itself on and given that the Rs are chosen as a function of Idss(min) and Vdd, there is little drop across Q1 and so the voltage at source of Q1 and the top of R2 is approximately ground or 0 volts. Thus, with R2=R3, the voltage at point B is the midpoint between ground and Vss which is −2.5 volts.

Thus, for a logic 0 input (−2.5 volts), the output is at logic 1 (0 volts) and for a logic 1 input (0 volts), the output is a logic 0 (−2.5 volts). The device is a logical inverter.

Figure 2A:
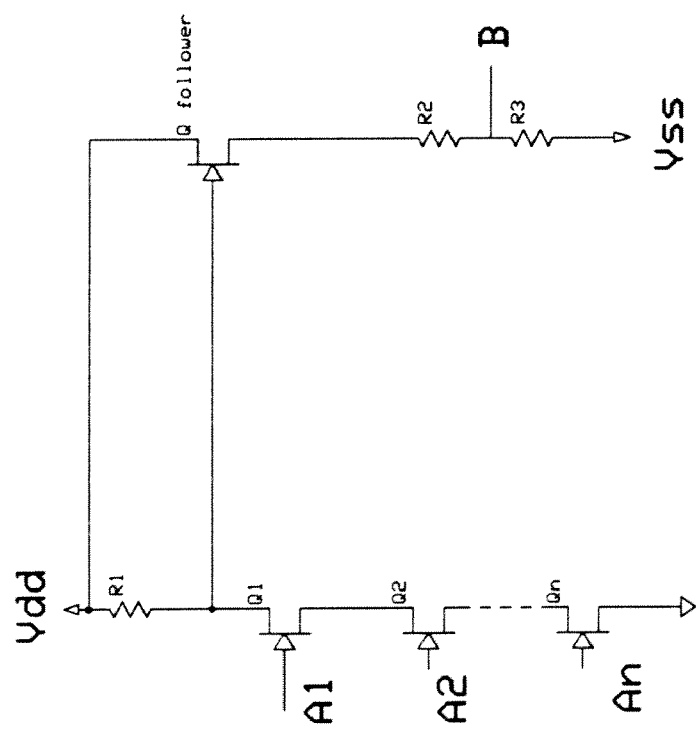
FIG. 2a illustrates another embodiment of an inverter architecture in which an embodiment the present invention may be implemented with a series string of n FETs.

FIG. 2a illustrates another embodiment of an inverter architecture. By replacing Q1 with a series string of n FETs (Q1-Qn), the device becomes an n input NAND gate where the output remains at logic 1 until all n inputs are at logic 1 at which time it will go to logic 0. The inputs are the gates of Q1-Qn, illustrated as points A1-An. The output of the gate is given as the node where R2 connects to R3 and is illustrated as point B. Following the front end is a FET, Q follower, configured as a unity gain buffer whose drain is tied to Vdd, whose gate is tied to the node connecting Q1-Qn and R1, and whose drain is tied to the series combination of resistors, R2 and R3.

Figure 2B:
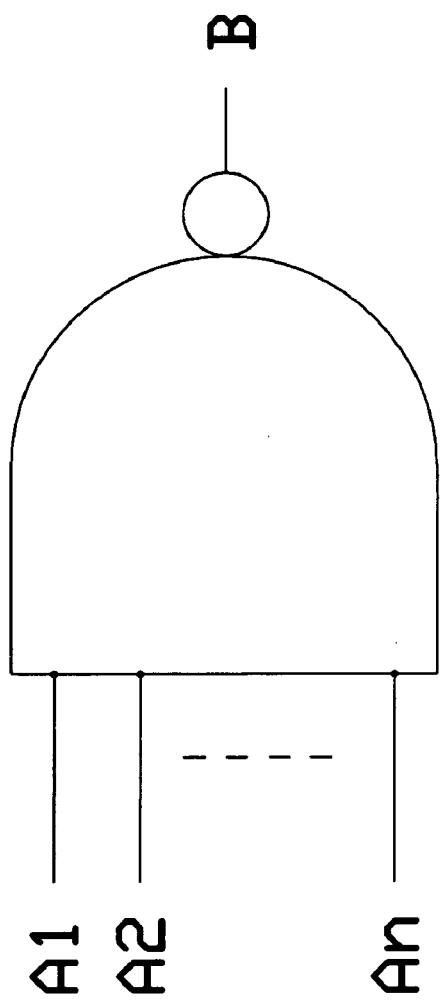

FIG. 2b illustrates the logical representation of FIG. 2a.

Figure 3:
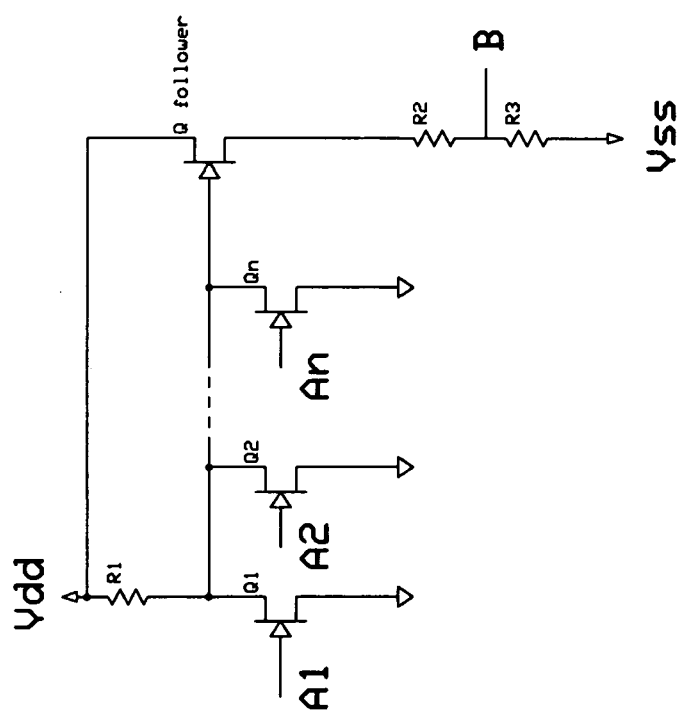

FIG. 3a illustrates another embodiment of an inverter architecture. By replacing Q1 with a parallel string of m FETs (Q1-Qn), as shown in FIG. 3a, the device becomes an m input NOR gate in which the output will go to logic 0 if any or all of the m inputs are at logic 1. The inputs are the gates of Q1-Qn, illustrated as points A1-An. The output of the gate is given as the node where R2 connects to R3 and is illustrated as point B. Following the front end is a FET, Q follower, configured as a unity gain buffer whose drain is tied to Vdd, whose gate is tied to the node connecting Q1-Qn and R1, and whose drain is tied to the series combination of resistors, R2 and R3.

Figure 3B:
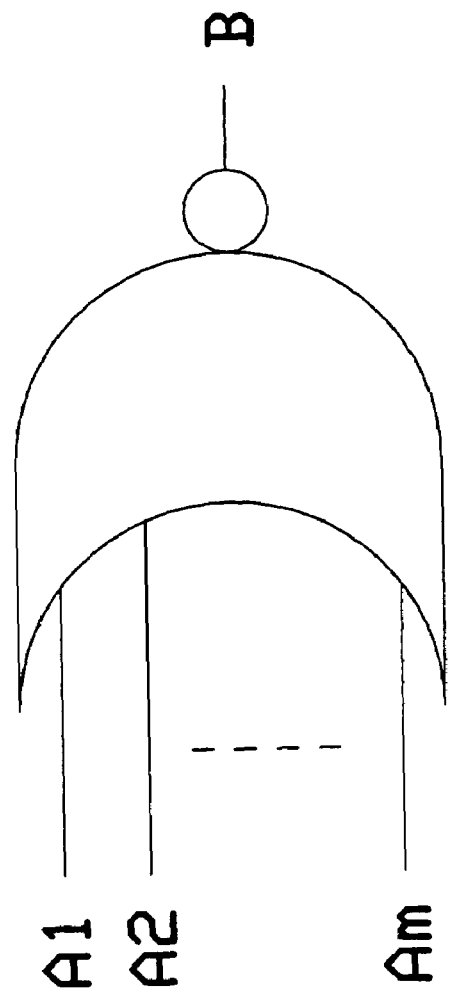

FIG. 3b illustrates the logical representation of FIG. 3a.

Figure 4:
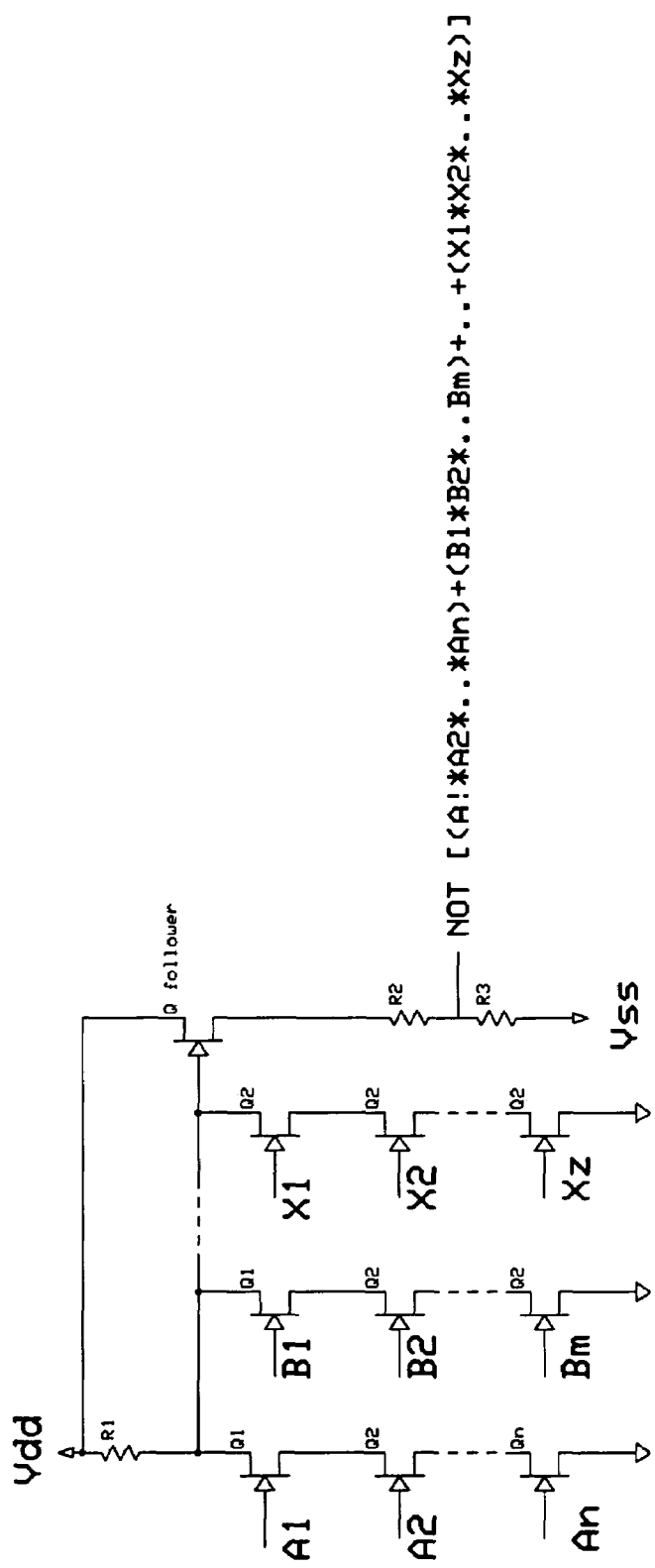
FIG. 4 illustrates another embodiment of an inverter architecture with a complex combinatorial logic function.

FIG. 4 illustrates another embodiment of an inverter architecture. As shown in FIG. 4, any combination of n series FETs (NAND structure) and m parallel FETs (NOR structure) at the input creates the complex combinatorial logic function. This configuration is known as a sum of products. A product of sums can also be configured by simply stacking the NOR functions, each atop of the other, using the vertical NAND structure. The inputs are the gates of Q1-Qn, illustrated as points A1-An, B1-Bn and X1-Xn. The output of the gate is given as the node where R2 connects to R3 and is illustrated as point NOT [(A1*A2* ... *An)+(B1*B2* ... *Bn)+ ... + (X1*X2* ... *Xn)]. Following the front end is a FET, Q follower.

Figure 5:
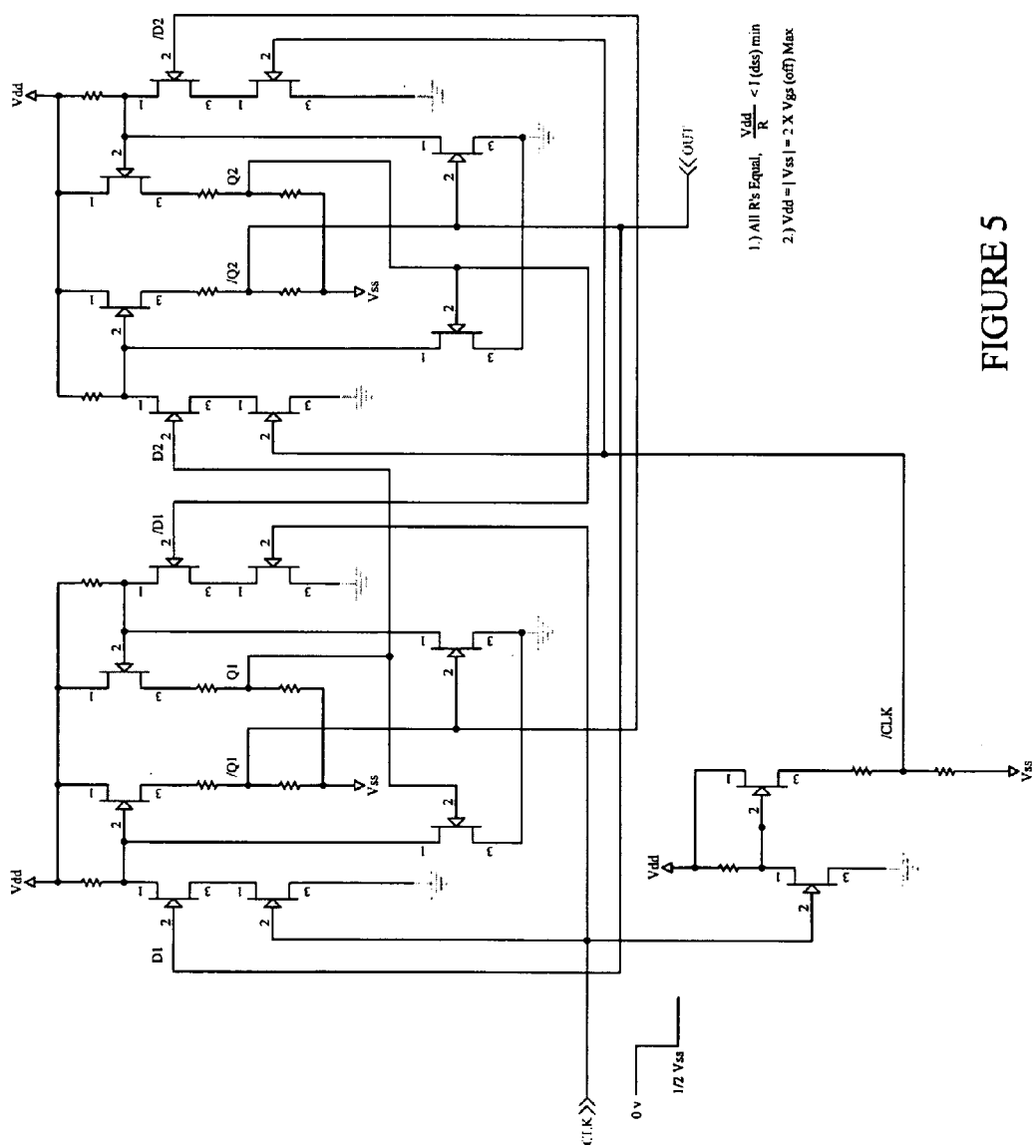
FIG. 5 illustrates an embodiment of the invention in which a divide by two counter is presented.

FIG. 5 illustrates an embodiment of the invention in which a divide by two counter is presented. Using NAND or NOR synthesis, cross coupled set reset flip flops can be configured. Thus, higher level constructs such as an edge triggered D flip flop can be made. It utilizes an edge triggered D flip flop in the classic /Q feed back to input D configuration.

Figure 6:
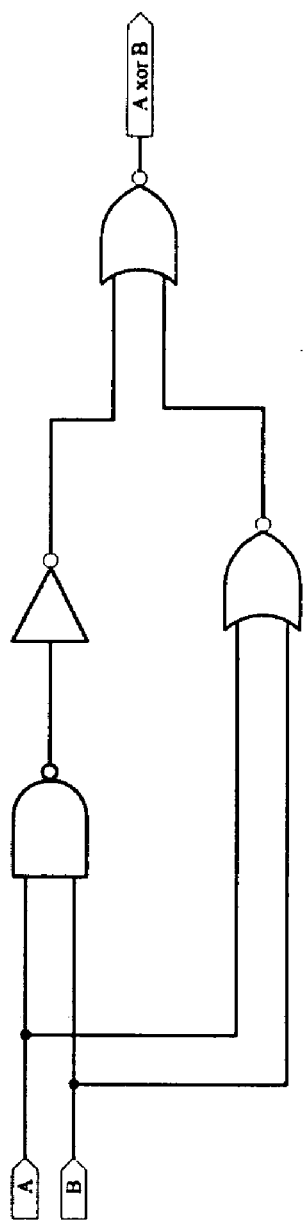
FIG. 6 illustrates an embodiment of the invention using NAND gates, NOR gates and inverters.

Using NAND gates, NOR gates and inverters, one can configure any common realization of the exclusive OR or exclusive NOR functions, XOR and XNOR respectively, as illustrated in FIG. 6. Thus, according to embodiments of the present invention, using the aforementioned building blocks, any combinatorial, pulse or edge triggered device can be synthesized.

The present invention, therefore, allows device parameters to differ while still maintaining the functionality of the circuit. In current SiC MESFET transistors, logic gates constructed from SiC MESFET transistors could not be turned off sufficiently for practical logic gate operation and had poor endurance at high temperatures. As such, there are no instances in the current art of logic devices performing reliably for substantial periods of time at high temperature. The present invention has demonstrated that using an random sampling of an arbitrarily chosen N channel JFET as a model, allows for the development of reliable, high temperature logic functions for high temperature, high ionizing radiation environments.

The present invention may therefore be used in commercial applications that require high temperature, high radiation and hard logic devices. For example, the present invention may be used in high temperature wireless sensors. In another example, oscillators using resistive and capacitive sensors as time base components and built around SiC logic gates would be useful point of source digitizers of sensed variables in a high temperature environment, such as a jet engine, near a hydrothermal vent, or at a drill head in deep hole environments. The output of the oscillator may be used to drive a binary polynomial generator unique to that sensor while also modulating the output of the oscillator by the polynomial prior to transmitting it on a wire or over air. This will give that sensor a unique signature. Multiple sensors transmitting on the same medium can then be singled out through source separation algorithms.

State machines may also be built out of SiC logic devices, giving processing capability to devices, fixed and mobile, operating in high temperature environments. An example would be a robot operating on the surface of Venus with expected temperatures up to 460° C. A state machine built out of SiC logic could direct the vehicle as it avoids obstacles, deploys sensors, or transmits telemetry to other devices, etc. Given the added radiation hardness of SiC, robots could be made to enter nuclear power plants during and after a meltdown for mitigation or clean up. The extreme temperatures and radiation fluence could be tolerated by a SiC based robot.

The inverter of an embodiment of the invention allows for the creation of an analog amplifier. With its known output impedance as a function of R2 and R3, feeding the output back to the input and by including an input resistor, a negative feedback ratio can be configured and the resulting circuit is that of an analog amplifier. This amplifier can be configured into the various and well known functions such as a voltage amplifier, a summer, an integrator, a differentiator and other analog functions.

As noted above, the present invention therefore allows for combinatorial, pulse and clock mode logical devices, oscillators and analog building blocks all made from the state of the art in SiC JFET devices and epitaxial resistors and which can operate at temperatures exceeding 500° C.

The foregoing description has been directed to specific embodiments of this invention. It will be apparent; however, that other variations and modifications may be made to the described embodiments, with the attainment of some or all of their advantages. Therefore, it is the object of the appended claims to cover all such variations and modifications as come within the true spirit and scope of the invention.

What is claimed:

1. An apparatus configured to create digital logic gates, comprising:
   a first field effect transistor, at a front end, whose source is tied to zero volts and whose drain is tied to voltage (Vdd) through a first resistor; and
   a second field effect transistor, following the front end, configured as a unity gain buffer whose drain is tied to the Vdd, whose gate is tied to a node connecting the first field effect transistor to the first resistor, and whose drain is tied to a series combination of a second resistor and a third resistor,
   wherein for a logic false input, the output is at logic true and for a logic true input, the output is at logic false, and
   wherein the bottom of the third resistor is tied to Vss, wherein Vss is equal to negative Vdd.

2. The apparatus of claim 1, wherein the first, second and third resistors are equal.

3. The apparatus of claim 1, wherein the input is a gate of the first field effect transistor and the output of the gate is a node where the second resistor connects to the third resistor.

4. The apparatus of claim 1, wherein the first field effect transistor is a series string of n field effect transistors, wherein the apparatus becomes an n input NAND gate where the output remains at logic true until all n inputs are at logic true at which time the output will go to logic false.

5. The apparatus of claim 1, wherein the first field effect transistor is a parallel string of m field effect transistors, wherein the apparatus becomes an m input NOR gate in which the output is configured to go to logic false if any or all of the m inputs are at logic true.

6. The apparatus of claim 1, wherein any combination n series field effect transistors and m parallel field effect transistors at the input creates a complex combinatorial logic function.

7. The apparatus of claim 1, further comprising a divide by two counter, wherein using NAND or NOR synthesis, cross coupled set reset flip flops can be configured.

8. The apparatus of claim 1, wherein the resistors values are a function of supply voltage, which in turn, is a function of the field effect transistors turn off voltage.

9. The apparatus of claim 1, wherein each field effect transistor is a u401 dual negatively doped channel junction field effect transistor.

10. The apparatus of claim 1, wherein the apparatus is configured to use NAND gates, NOR gates and inverters.

11. The apparatus of claim 1, wherein the apparatus is configured to produce inverting and combinatorial logic, thereby enabling the production of pulse and edge triggered latches.

12. A method, comprising:
    placing, at a front end of an inverter, a first field effect transistor whose source is tied to zero volts and whose drain is tied to voltage (Vdd) through a first resistor;
    placing, following the front end, a second field effect transistor configured as a unity gain buffer whose drain is tied to the Vdd, whose gate is tied to a node connecting the first field effect transistor to the first resistor, and whose drain is tied to a series combination of a second resistor and a third resistor; and
    tying the bottom of the third resistor to Vss, wherein Vss is equal to negative Vdd,
    wherein for a logic false input, the output is at logic true and for a logic true input, the output is at logic false.

13. An apparatus, comprising:
    placing means for placing, at a front end of an inverter, a first field effect transistor whose source is tied to zero volts and whose drain is tied to voltage (Vdd) through a first resistor; and
    placing means for placing, following the front end, a second field effect transistor configured as a unity gain buffer whose drain is tied to the Vdd, whose gate is tied to a node connecting the first field effect transistor to the first resistor, and whose drain is tied to a series combination of a second resistor and a third resistor, wherein for a logic false input, the output is at logic true and for a logic true input, the output is at logic false, and wherein the bottom of the third resistor is tied to Vss, wherein Vss is equal to negative Vdd.

\* \* \* \* \*